(12) United States Patent
Steiner et al.

(10) Patent No.: US 11,323,822 B2
(45) Date of Patent: May 3, 2022

(54) LOW-PASS FILTER ARRANGEMENT

(71) Applicant: ams International AG, Rapperswil (CH)

(72) Inventors: Matthias Steiner, Rapperswil (CH); Thomas Froehlich, Rapperswil (CH)

(73) Assignee: AMS INTERNATIONAL AG, Rapperswil (CH)

( * ) Notice: Subject to any disclaimer, the term of this patent is extended or adjusted under 35 U.S.C. 154(b) by 42 days.

(21) Appl. No.: 16/765,373

(22) PCT Filed: Nov. 19, 2018

(86) PCT No.: PCT/EP2018/081798
§ 371 (c)(1),
(2) Date: May 19, 2020

(87) PCT Pub. No.: WO2019/105788
PCT Pub. Date: Jun. 6, 2019

(65) Prior Publication Data
US 2020/0344556 A1    Oct. 29, 2020

(30) Foreign Application Priority Data
Nov. 28, 2017 (EP) .................................... 17204027

(51) Int. Cl.
*H04R 19/00* (2006.01)
*H03H 7/01* (2006.01)
(Continued)

(52) U.S. Cl.
CPC ......... *H04R 19/005* (2013.01); *H03H 7/0107* (2013.01); *H03H 11/0405* (2013.01);
(Continued)

(58) Field of Classification Search
CPC combination set(s) only.
See application file for complete search history.

(56) References Cited

U.S. PATENT DOCUMENTS

| | | | | |
|---|---|---|---|---|
| 3,524,081 A | * | 8/1970 | Campanella | ............ H03G 5/22 327/330 |
| 4,198,612 A | * | 4/1980 | Morton | ................ H03H 7/0107 333/17.1 |

(Continued)

OTHER PUBLICATIONS

European Patent Office, International Search Report for PCT/EP2018/081798 dated Feb. 12, 2019.

(Continued)

*Primary Examiner* — Angelica M McKinney
(74) *Attorney, Agent, or Firm* — MH2 Technology Law Group LLP

(57) ABSTRACT

In an embodiment a low-pass filter arrangement has an input terminal for receiving an input voltage, a first voltage source coupled to the input terminal, a serial connection comprising a first and a second filter diode, the serial connection being coupled to the first voltage source, wherein a connection point between the first and the second filter diode is coupled to an output terminal of the filter arrangement, and a first filter capacitor coupled between the output terminal and a filter reference potential terminal. Therein the first voltage source is adapted to provide a first adjustable forward voltage whereby the first and the second filter diodes are both biased in a forward direction.

15 Claims, 5 Drawing Sheets

(51) Int. Cl.
*H03H 11/04* (2006.01)
*H03H 11/54* (2006.01)
*H02M 3/07* (2006.01)

(52) U.S. Cl.
CPC .............. *H03H 11/54* (2013.01); *H02M 3/07* (2013.01); *H02M 3/076* (2021.05)

(56) References Cited

U.S. PATENT DOCUMENTS

| | | | | |
|---|---|---|---|---|
| 4,539,617 | A * | 9/1985 | Delaney | H02H 9/04 361/111 |
| 4,994,774 | A * | 2/1991 | Joosse | H03H 7/06 333/172 |
| 8,197,127 | B2 * | 6/2012 | Zegheru | G01K 7/01 374/100 |
| 8,947,067 | B1 * | 2/2015 | Zarei | G05F 3/30 323/313 |
| 2010/0246859 | A1 * | 9/2010 | David | H02M 3/07 381/120 |
| 2012/0194967 | A1 * | 8/2012 | Keane | H01C 13/00 361/437 |
| 2016/0073212 | A1 | 3/2016 | Zeleznik | |

OTHER PUBLICATIONS

Jawed, S. A et al.: "A 828 μW 1.8V 80dB dynamic-range readout interface for a MEMS capacitive microphone" IEEE Article 2008, pp. 442-445.

Van den Boom, J.:"A 50 μW biasing feedback loop with 6ms settling time for a MEMS microphone with digital output" ISSCC 2012—Feb. 21, 2012, 1 page.

* cited by examiner

LOW-PASS FILTER ARRANGEMENT

The disclosure is directed to a low-pass filter arrangement.

The field of this disclosure concerns low-pass filtering, especially, low-pass filtering in the provision of a bias voltage for micro-electromechanical systems, MEMS, sensors.

BACKGROUND

Capacitive microphone MEMS sensors require a high direct current, DC, biasing voltage, e.g. 20V, for the sensor operation. The term biasing means establishing at least one predetermined voltage or current at at least one point of an electric circuit for the purpose of establishing proper operating conditions in at least one component of said circuit. An operating point is therefore also denoted a bias point and refers to a steady-state DC voltage at a specified terminal of an active device, e.g. a transistor, in a circuit.

In the case of capacitive microphone MEMS the required biasing voltage is generated with e.g. a charge pump which is integrated into an integrated circuit, IC, interfacing to the sensor. Since noise voltage on the biasing voltage adds to overall microphone noise, a low-pass filter with a low cut-off frequency which usually lies below 10 Hz is needed at the output of the charge pump in order to filter the voltage provided by the charge pump. Implementing a low corner frequency into an integrated circuit requires a large resistance to keep the capacitor size feasible.

At the same time, the output voltage after the low-pass filter which is seen by the sensor should settle or recover fast e.g. within a few tens of milliseconds after power up or after a discharging event in the sensor to satisfy start up requirements of a corresponding application. It is also desirable not to have a drift of the biasing voltage over temperature because such drift would negatively influence the overall microphone gain drift, which is particularly adverse in sensors requiring a lower biasing voltage.

In a known approach, diodes are used as filter resistance elements in filtering a voltage provided by a charge pump in a MEMS microphone. A typical circuit configuration of said approach is shown in FIG. 12. The charge pump generates a high voltage Vpump at e.g. 20V, which is filtered by the first order low-pass consisting of a filter capacitor Cfilt, a diode D1 and/or a diode D2 for the case of a negative leakage current Ilk. A bias voltage Vbias is provided therefrom. The diodes D1 and D2 are coupled in a back-to-back parallel connection. In general, a diode's current-voltage characteristic follows an exponential relationship, namely:

$$I = I_s * e^{U/26\,mV}$$

Therein, I represents the diode's current I, Is represents the reverse bias saturation current Is, U represents the voltage across the diode. The thermal voltage amounts to 26 mV.

Said relationship provides the required large small-signal resistance as long as the diode current is small at very little silicon area cost. The small signal resistance of a diode is determined according to the following formula:

$$R = \frac{26\,mV}{I}.$$

Therein, R represents the diode's small signal resistance R and I represents the diode's current I.

For example a large small-signal resistance of 26 GOhm is realized at a diode current of 1 pA.

A large signal output plot on the right side of FIG. 12 shows the combined characteristic of the two diodes D1 and D2. The cross marks the location of an example static operating point at the usually positive leakage current Ilk resulting in a difference between the voltages Vpump and Vbias. As can be seen, there is a wide critical range of bias voltages Vbias where the operating point is defined by small leakage currents, i.e. small changes in leakage current Ilk cause a significant change in the bias voltage Vbias in a state in which neither of the diodes D1 or D2 conducts. Additionally, time constants grow very large in this critical range due to the large small-signal resistances of the diodes. This introduces undesired inaccuracy and slow settling effects at the bias voltage Vbias.

In order to reduce startup time resulting from a slow filter settling, a higher charge pump voltage can be activated for the first few milliseconds after power up. This approach comes with the disadvantage of generating artifacts at certain temperatures later during the startup phase due to a complex settling process of the combined high impedance nodes around the MEMS sensor. Also, it does not address the recovery from a possible discharging event which also affects the filter at the output of the charge pump.

The definitions as described above also apply to the following description unless stated otherwise.

SUMMARY

In one embodiment a low-pass filter arrangement has an input terminal for receiving an input voltage, a first voltage source coupled to the input terminal, a serial connection and a first filter capacitor. The serial connection comprises a first and a second filter diode and is coupled to the first voltage source. A connection point between the first and the second filter diode is coupled to an output terminal of the filter arrangement. The first filter capacitor is coupled between the output terminal and a filter reference potential terminal. The first voltage source is adapted to provide a first adjustable forward voltage whereby the first and the second filter diodes are both biased in a forward direction.

The input voltage is filtered in the low-pass filter arrangement by the first and second filter diodes forming the resistive element of the resulting low-pass filter arrangement and the first filter capacitor forming the capacitive element of the low-pass filter arrangement. By way of the first adjustable forward voltage, which is provided by the first voltage source, each of the first and the second filter diode is biased in a forward direction, i.e. the voltage applied to each filter diode lies above said diode's forward voltage such that the diode is turned on and conducts. This changes the large signal characteristic at the output terminal of the low-pass filter arrangement such that a critical range of an uncertain voltage at the output terminal is reduced by the magnitude of the first adjustable forward voltage. Consequently, a voltage at the output terminal of the low-pass filter arrangement is provided with higher accuracy and a shorter startup time compared to the state of the art. The voltage at the output terminal of the low-pass filter arrangement is therefore well suited to be used as biasing voltage in a MEMS sensor, for example.

The first and the second filter diode may each be realized by a bipolar diode or by a metal oxide semiconductor, MOS, diode or a combination thereof. In an example implementation the first diode is realized by an n-diffusion in a p-well and the second diode is realized by a p-diffusion in an n-well. The input voltage is provided by any kind of voltage source, for instance, a charge pump. The first adjustable forward voltage is tuned such that a resulting forward current through the first and the second filter diode does not excessively reduce the small signal resistance of the first and the second filter diode in order not to compromise the desired low filter cut-off or corner frequency to be realized by the low-pass filter arrangement. This is referred to as "slightly biased in a forward direction" in the following. At the same time, the first adjustable forward voltage is determined such that it does not introduce a relevant amount of shot noise at the voltage provided at the output terminal.

In an exemplary implementation the connection point between the first and the second filter diode is directly connected to the output terminal. This connection point is also directly connected to one terminal of the first filter capacitor. The term directly connected herein defines a connection between two circuit elements which is realized by the connecting wire only, without any other circuit elements in between. In contrast to this direct connection, the terms coupled or connected are synonymously used herein to specify a connection between two circuit elements which connection is not direct, but other circuit elements, e.g. a resistor or a voltage source, can be connected additionally between the two elements.

In a further development the first voltage source comprises a first current source, a second current source, a resistor, a first replica diode and a second replica diode, wherein the first current source is coupled to a supply potential terminal and in series to a serial connection consisting of the first and the second replica diode. Said serial connection in turn is coupled to a generation reference potential terminal. A connection point between the first current source and said serial connection of first and second replica diodes forms a first output of the first voltage source. The second current source is coupled to the supply potential terminal and in series to the resistor which in turn is coupled to the generation reference potential terminal. A connection point between the second current source and the resistor forms a second output of the first voltage source. An absolute value of the first adjustable forward voltage is provided between the first and the second output of the first voltage source.

The first output of the first voltage source realizes for example a positive terminal, while the second output of the first voltage source realizes a negative terminal.

A potential at the filter reference potential terminal may differ from a potential at the generation reference potential terminal.

In a development of the first voltage source, the first current source is adapted to provide a first biasing current with an adjustable level, the second current source is adapted to provide a second biasing current, a level of which is a function of an absolute temperature of the filter arrangement. The first replica diode is adapted in size to the first filter diode of the filter arrangement in order to form a replica of said first filter diode. The second replica diode is adapted in size to the second filter diode of the filter arrangement in order to form a replica of said second filter diode.

A replica may also be denoted as a component with matching layout.

The first biasing current is flowing through the first and the second replica diodes which are respectively matching the first and the second filter diodes of the low-pass filter arrangement. A corresponding voltage drop is generated across the first and the second replica diodes. The second biasing current crossing the resistor causes a temperature-dependent voltage drop across said resistor. Said temperature-dependent voltage drop is subtracted from the voltage drop across the first and the second replica diodes. This subtraction allows the first biasing current to be dimensioned reasonably large for a robust design, for instance in the range of 1 µA, and still to accurately adjust the first adjustable forward voltage generated by the first voltage source to cause a small forward current, e.g. of 1 pA, in the first and second filter diode of the low-pass filter arrangement. This is because the current ratio between the replica diodes and the first and the second filter diodes is well controlled according to the relation $$\frac{IDreplica}{IDfilter} = e^{\frac{\Delta V_{ptat}}{kT/q}} \qquad (a)$$

wherein IDreplica represents the current through the replica diodes, IDfilter represents the current through the filter diodes, $\Delta V_{ptat}$ represents the voltage drop across the resistor, k represents the Boltzmann constant k, T represents the absolute temperature T and q represents the elementary charge q. The quotient of the product of the Boltzmann constant k and the absolute temperature T and the elementary charge q is referred to as the thermal voltage.

The current ratio can consequently be easily designed to very large values in order to establish a small current for the filter diodes.

The described embodiment of the first voltage source tracks temperature changes and process variations, such that the current through the filter diodes is well controlled. It takes into account the temperature dependency of the forward voltage of a diode for a given current. Thereby, a suitable compromise between the size of the critical range and adverse effects of too much forward biasing of the filter diodes is achieved.

The critical range thereby refers to the critical range of voltages at the output terminal of the low-pass filter arrangement, where said voltage is not well defined and prone to slow settling effects. Reduction of the critical range results in a more accurate absolute output voltage of the filter arrangement and in a shorter time until the final settled operating voltage at the output of the proposed low-pass filter arrangement is reached.

In an alternative the first voltage source comprises a second and a third voltage source which are connected in series to each other. A connection point between the second and the third voltage source is connected to the input terminal of the filter arrangement. An absolute value of the first adjustable forward voltage is provided as the sum of a second adjustable forward voltage provided by the second voltage source and a third adjustable forward voltage provided by the third voltage source.

In this embodiment the first voltage source is realized by a serial connection of the second and the third voltage source. Here, the connection point between first and second filter diode is coupled to the output terminal. The first adjustable forward voltage is, so to say, split into two parts, namely a second adjustable forward voltage and the third adjustable forward voltage. The input voltage is fed to the connection point between the second and the third voltage source. This further improves the DC accuracy of the voltage at the output terminal of the low-pass filter arrangement, because the strongly temperature-dependent forward voltage of the first and the second filter diodes is cancelled out to first order.

In a development each of the second voltage source and the third voltage source comprises a third current source, a fourth current source, a resistor and a first or a second replica diode. The third current source is coupled to a supply potential terminal and in series to the first or to the second replica diode which in turn is coupled to the generation reference potential terminal. A connection point between the third current source and said replica diode forms a first output of the second or the third voltage source. The fourth current source is coupled to the supply potential terminal and in series to the resistor which in turn is coupled to the generation reference potential terminal. A connection point between the fourth current source and the resistor forms a second output of the second or the third voltage source. The second or the third adjustable forward voltage is provided respectively between the first and the second output of the second or the third voltage source.

In detail, the second voltage source has the third current source, the fourth current source, the resistor and the first replica diode which are coupled amongst each other as described above. The second adjustable forward voltage is provided between the connection point of the third current source with the first replica diode and the connection point between the fourth current source and the resistor. The third voltage source has the third current source, the fourth current source, the resistor and the second replica diode which are coupled as defined above. The third adjustable forward voltage is provided between the connection point between the third current source and the second replica diode and the connection point of the fourth current source with the resistor.

In a development the third current source is adapted to provide a third biasing current with an adjustable level. The fourth current source is adapted to provide a fourth biasing current, a level of which is a function of an absolute temperature of the low-pass filter arrangement. The first replica diode is adapted in size to the first filter diode of the filter arrangement in order to form a replica of said first filter diode. The second replica diode is adapted in size to the second filter diode of the filter arrangement in order to form a replica of said second filter diode.

The third biasing current generates a voltage drop across the first or the second replica diode. The fourth biasing current generates a temperature-dependent voltage drop across the resistor which is subtracted from the voltage drop across the first or the second replica diode. Consequently, the temperature dependency of the forward voltage of the first and the second filter diodes is taken into account in the generation of the second and the third adjustable forward voltage. This in turn results in a reduction of the critical range of the voltage at the output of the low-pass filter arrangement in this embodiment.

In another embodiment the low-pass filter arrangement further comprises a fourth voltage source, a third and a fourth filter diode, a second filter capacitor and a cross capacitor. The fourth voltage source is coupled in series to the first voltage source and to the input terminal. The third filter diode is coupled in series to the second filter diode and to the input terminal. The fourth filter diode is coupled in series to the first filter diode and to the first voltage source. The cross capacitor is connected to a connection point between the first and the fourth filter diode and to a connection point between the third and the second filter diode. The fourth voltage source is adapted to provide a fourth adjustable forward voltage whereby the third and the fourth filter diode are both biased in a forward direction.

The third and fourth filter diode are both slightly biased in a forward direction by the fourth adjustable forward voltage, like the first and the second filter diode are each slightly biased in a forward direction by the first adjustable forward voltage. In other words, the resulting series connection of first and fourth voltage source is biasing all four diodes in forward direction. The same current traverses all four diodes. By this, a second filter stage is realized in series to the first filter stage described above. Noise suppression is further improved. As the cross capacitor does not see the high voltage of the input terminal of the low-pass filter arrangement, it can be implemented with a large capacitance compared to the capacitance of the first and the second filter capacitors.

In a development, the second filter capacitor is either realized by a single capacitor coupled to a connection point between the third and the second filter diode and the filter reference potential terminal, or the second filter capacitor is realized by two capacitors, wherein one of said two capacitors is connected to the connection point between the first and the fourth filter diode and the other one of said two capacitors is connected to the connection point between the third and the second filter diode.

In the realization in which the filter capacitor is implemented by two capacitors, the capacitance is distributed between the connection of first and fourth filter diodes and the connection of third and second filter diodes. A ratio of the distribution is determined according to the parasitic capacitances of the filter diodes in the branches.

In a development the first voltage source additionally comprises a charge pump circuit which is prepared to pump the first adjustable forward voltage to a level of the input voltage.

The charge pump circuit allows operation of the first adjustable forward voltage independent of the level of said first adjustable forward voltage. The first adjustable forward voltage is operated, for example, at the level of the input voltage.

In one embodiment said charge pump circuit comprises a main pumping path, a first gate control path and a second gate control path. The main pumping path has a first, a second, a third and a fourth transistor and a first and a second pumping capacitor. The first gate control path has a fifth and a sixth transistor and a first and a second supplementary capacitor. The second gate control path has a seventh and an eighth transistor and a third and a fourth supplementary capacitor. Each of the first and the second gate control path is respectively coupled to the main pumping path such that a control of the transistors of the main pumping path is independent of a level of the first adjustable forward voltage.

The main pumping path is used for pumping the first adjustable forward voltage to the level of the input voltage. As the first adjustable forward voltage has a magnitude, for example, of 400 mV, said voltage may not be used for switching the transistors of the main pumping path. The transistors of the charge pump circuit are realized as MOS transistors and require a gate control voltage which is higher than the value of the first adjustable forward voltage. Therefore, the first and the second gate control paths are respectively used to switch the transistors of the main pumping path in order to realize a charge pump for the relatively small first adjustable forward voltage. By this, the first adjustable forward voltage is copied to the first and the second filter diodes. The first and the second gate control path each provides respective gate control voltages for the transistors of the main pumping path that are higher than their threshold voltages such that the transistors of the main pumping path operate correctly.

The charge pump circuit as defined can be denoted a floating voltage source for the first adjustable forward voltage.

In a development respective source terminals of the first, the second, the seventh and the eighth transistor are connected to each other and are prepared to receive or to provide a negative voltage. Respective source terminals of the third, the fourth, the fifth and the sixth transistor are connected to each other and are prepared to receive or to provide a positive voltage.

In a development the first, the second, the seventh and the eighth transistor each comprise a metal-oxide semiconductor, MOS, transistor of a same type. The third, the fourth, the fifth and the sixth transistor each comprise a MOS transistor of a same type which is complementary to the type of the first, the second, the seventh and the eighth transistor.

In an example implementation the first, the second, the seventh and the eighth transistor each comprise an NMOS transistor, while the third, the fourth, the fifth and the sixth transistor each comprise a PMOS transistor.

In a development the first adjustable forward voltage is dynamically adjustable according to an actual temperature of the low-pass filter arrangement and/or according to a time of operation.

For example, at power up i.e. the start of operation of the low-pass filter arrangement, the first adjustable forward voltage is set to a higher value to allow the output voltage of the low-pass filter arrangement to settle quickly. After start of operation is completed, i.e. when the low-pass filter arrangement has reached steady state conditions, the first adjustable forward voltage is set to the lower value which satisfies the slight forward biasing of the filter diodes described above. Furthermore, the first adjustable forward voltage is adjusted taking into account the actual temperature.

By this, a tradeoff between settling speed and filtering performance with respect to noise is achieved for the first adjustable forward voltage over time.

In one embodiment a voltage sourcing arrangement comprises a low-pass filter arrangement as described above and an input signal source which is coupled to the input terminal of the low-pass filter arrangement. The input signal source is prepared to provide the input voltage for the low-pass filter arrangement.

The input signal source comprises a charge pump, for example. Said charge pump can be implemented by a standard charge pump known to those skilled in the art. A voltage provided at the output of the voltage sourcing arrangement which is represented by the voltage at the output terminal of the low-pass filter arrangement settles fast after power up or after a discharging event to its desired operating point. Furthermore, it is provided with reduced noise, even though a charge pump may be used as the input signal source.

By this, a well-controlled forward biasing of the filter diodes at the high voltage side of a charge pump, where the circuitry possibilities are strongly limited by the small charge pump driving capability, is achieved.

In one embodiment a microphone arrangement comprises a microelectromechanical system, MEMS, microphone and a voltage sourcing arrangement described above. The voltage provided at the output of the low-pass filter arrangement of the voltage sourcing arrangement is prepared to bias operation of the MEMS microphone.

As described above the microphone arrangement having the voltage sourcing arrangement with the low-pass filter arrangement specified above takes advantage of the voltage at the output of the low-pass filter arrangement. Said voltage is used as a bias signal which enables optimized operation of the microphone due to the enhanced filtering detailed above.

BRIEF DESCRIPTION OF THE DRAWINGS

The text below explains the proposed low-pass filter arrangement and the voltage sourcing arrangement in detail using exemplary embodiments with reference to the drawings. Components and circuit elements that are functionally identical or have the identical effect bear identical reference numbers. In so far as circuit parts or components correspond to one another in function, a description of them will not be repeated in each of the following figures.

Therein.

DETAILED DESCRIPTION

Figure 1:
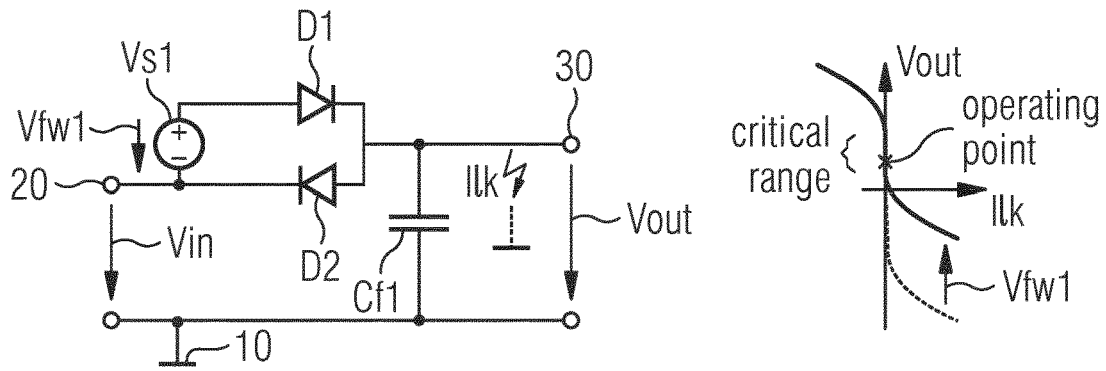
FIG. 1 shows a first embodiment example of a low-pass filter arrangement as proposed.

FIG. 1 shows a first embodiment example of a low-pass filter arrangement as proposed. The low-pass filter arrangement comprises an input terminal 20, a first filter diode D1, a second filter diode D2, a first filter capacitor Cf1 and a first voltage source Vs1. First and second filter diodes D1, D2 are coupled in a serial connection, i.e. a cathode terminal of the first filter diode D1 is coupled to an anode terminal of the second filter diode D2. A connection point of this serial connection which is represented by the cathode terminal of the first filter diode D1 or the anode terminal of the second filter diode D2 is coupled to an output terminal 30 of the low-pass filter arrangement. The first voltage source Vs1 is coupled between the input terminal 20 and the serial connection of first and second filter diodes D1, D2. In the depicted example, the first voltage source Vs1 is directly coupled to the input terminal 20 and to an anode terminal of the first filter diode D1. The first filter capacitor Cf1 is connected between the output terminal 30 and a filter reference potential terminal 10. An input voltage Vin is supplied to the input terminal 20. At the output terminal 30 an output voltage Vout is provided as a function of the input voltage Vin. The first voltage source Vs1 is prepared to provide a first adjustable forward voltage Vfw1 whereby the first and the second filter diodes D1, D2 are both biased in a forward direction.

Figure 12:
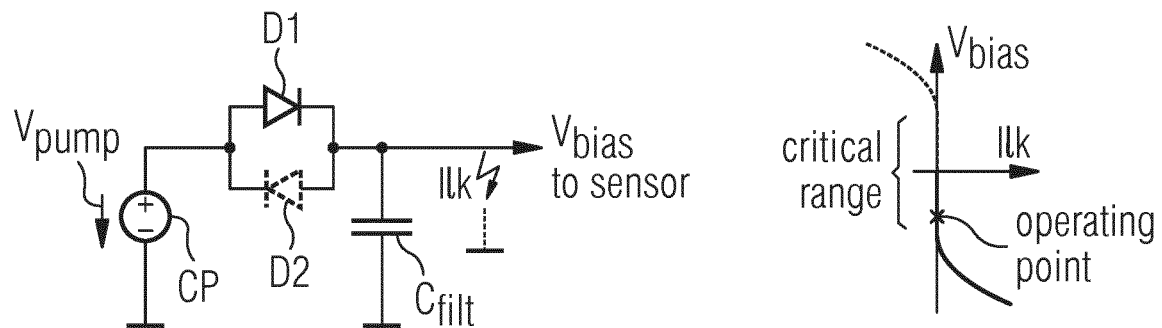
FIG. 12 shows the combined characteristics of two diodes D1 and D2.

The input voltage Vin is filtered in the low-pass filter arrangement forming a low-pass of first order and the output voltage Vout is provided accordingly. Through the forward biasing of the first and the second filter diodes D1, D2 a critical range of an operating point of the output voltage Vout provided by the low-pass filter arrangement is greatly reduced. This can be seen on the right-hand side of FIG. 1 depicting a relationship between the leakage current Ilk at the output terminal 30 of the low-pass filter arrangement and the output voltage Vout. In comparison to a corresponding diagram shown in FIG. 12 and relating to the state of the art low-pass filter, it can be seen that the critical range is reduced by the magnitude of the first adjustable forward voltage Vfw1 in the low-pass filter arrangement of FIG. 1.

In theory the critical range could be reduced to zero. However, in practice the first adjustable forward voltage Vfw1 has to be limited such that a resulting forward current through the first and the second filter diodes D1, D2 does not excessively reduce the small signal resistance of the first and the second filter diodes D1, D2 which would affect the desired low filter corner frequency.

Figure 8:
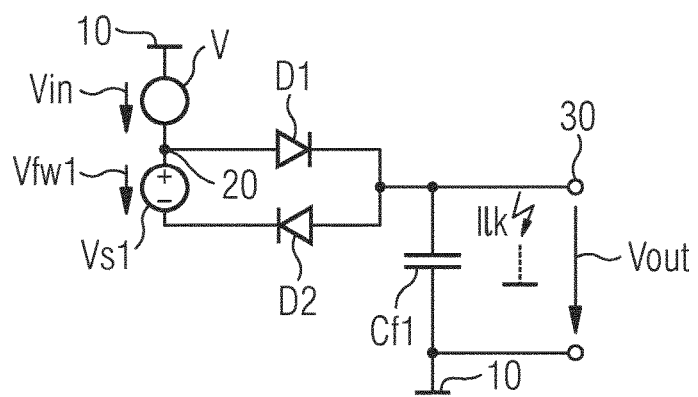
FIG. 8 shows a first embodiment example of a voltage sourcing arrangement as proposed.

In an alternative, the input voltage Vin is provided to the anode terminal of the first filter diode D1. Said alternative is depicted in FIG. 8.

Figure 2:
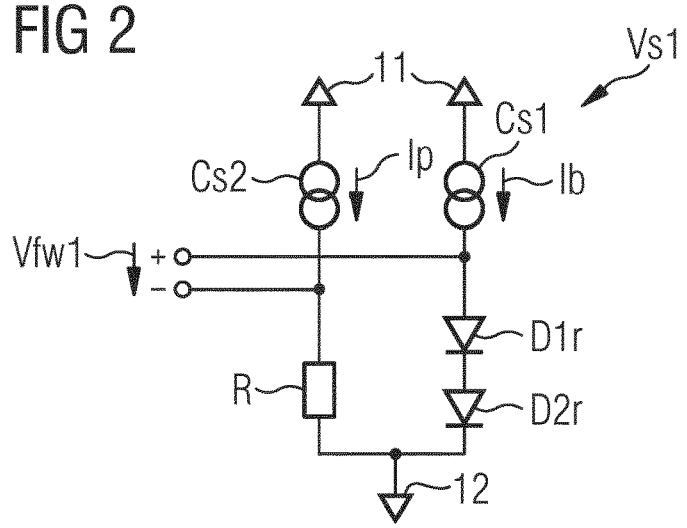
FIG. 2 shows an embodiment example of a first voltage source as proposed.

FIG. 2 shows an embodiment example of a first voltage source as proposed. The first voltage source comprises a first current source Cs1, a second current source Cs2, a resistor R, a first replica diode D1r and a second replica diode D2r. The first and the second replica diodes D1r, D2r are coupled in a serial connection, i.e. a cathode terminal of the first replica diode D1r is coupled to an anode terminal of the second replica diode D2r whose cathode terminal is coupled to a generation reference potential terminal 12. The first current source Cs1 is connected on one side to a supply potential terminal 11 and on the other side to the serial connection of first and second replica diodes D1r, D2r. A connection point between the serial connection of first and second replica diodes D1r, D2r and the first current source Cs1, which in this case is represented by the anode terminal of the first replica diode D1r, forms a first output of the first voltage source Vs1. The second current source Cs2 is coupled on one side to the supply potential terminal 11 and on the other side to the resistor R which in turn is coupled to the generation reference potential terminal 12. A connection point between the second current Cs2 and the resistor R forms a second output of the first voltage source.

The first current source Cs1 is prepared to provide a first biasing current Ib with an adjustable level, while the second current source Cs2 is prepared to provide a second biasing current Ip. A level of the second biasing current Ip is a function of an absolute temperature of the low-pass filter arrangement. For this reason, the second current source Cs2 is realized, for example, by a proportional to absolute temperature, PTAT, current source. A voltage drop generated across the resistor R is consequently proportional to the absolute temperature and can also be called a PTAT voltage drop. The first biasing current Ib is adjusted to a level which is higher than the desired forward current through the first and the second filter diodes D1, D2 of the low-pass filter arrangement. The $\Delta V_{ptat}$ voltage drop across the resistor R is subtracted from a voltage drop across the serial connection of the first and the second replica diode D1r, D2r. Said difference is provided as an absolute value of the first adjustable forward voltage Vfw1 between the first and the second output of the first voltage source. The resistor R is dimensioned such that it determines the desired current ratio between the current through the replica diodes and the current through the filter diodes as defined above in equation (a).

By way of the depicted circuit of FIG. 2 the first adjustable forward voltage Vfw1 tracks temperature changes and process variations such that the forward current through the filter diodes D1, D2 is well controlled.

In an alternative implementation of the circuit of FIG. 2, the first voltage source is realized by setting the value of the resistor R to zero and eliminating the second current source Cs2. The second output of the first voltage source Vs1 is consequently represented by the generation reference potential terminal 12. The first adjustable forward voltage is provided as the voltage drop across the serial connection of the first and the second replica diode D1r, D2r.

Figure 3:
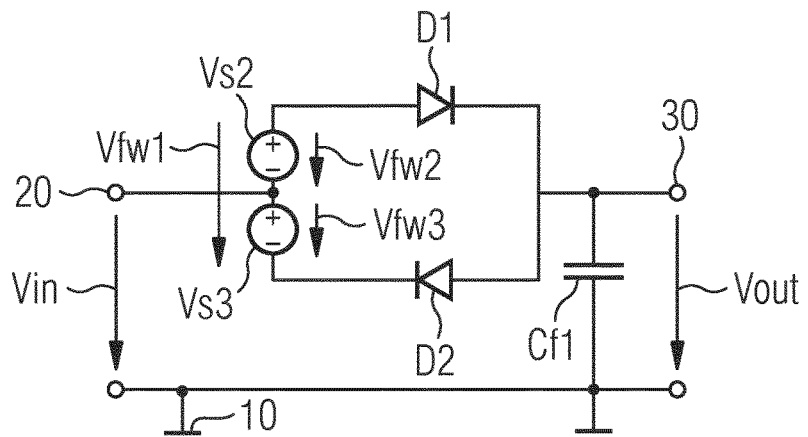
FIG. 3 shows a second embodiment example of a low-pass filter arrangement as proposed.

FIG. 3 shows a second embodiment example of a low-pass filter arrangement as proposed. The depicted embodiment example coincides with the first embodiment example of the low-pass filter arrangement depicted in FIG. 1, however, the first voltage source Vs1 of FIG. 1 is implemented by a series connection of a second voltage source Vs2 and a third voltage source Vs3, as shown in FIG. 3. A connection point between the second voltage source Vs2 and the third voltage source Vs3 is connected to the input terminal 20. In detail, the second voltage source Vs2 is connected between the anode terminal of the first filter diode D1 and the input terminal 20. The third voltage source Vs3 is connected between the cathode terminal of the second filter diode D2 and the input terminal 20. The first adjustable forward voltage Vfw1 is provided as a sum of a second adjustable forward voltage Vfw2 provided by the second voltage source Vs2 and a third adjustable forward voltage Vfw3 provided by the third voltage source Vs3.

This low-pass filter arrangement further improves the DC accuracy of the output voltage Vout due to the fact that the strongly temperature-dependent forward voltage of the filter diodes D1, D2 is cancelled out to first order.

Figure 4:
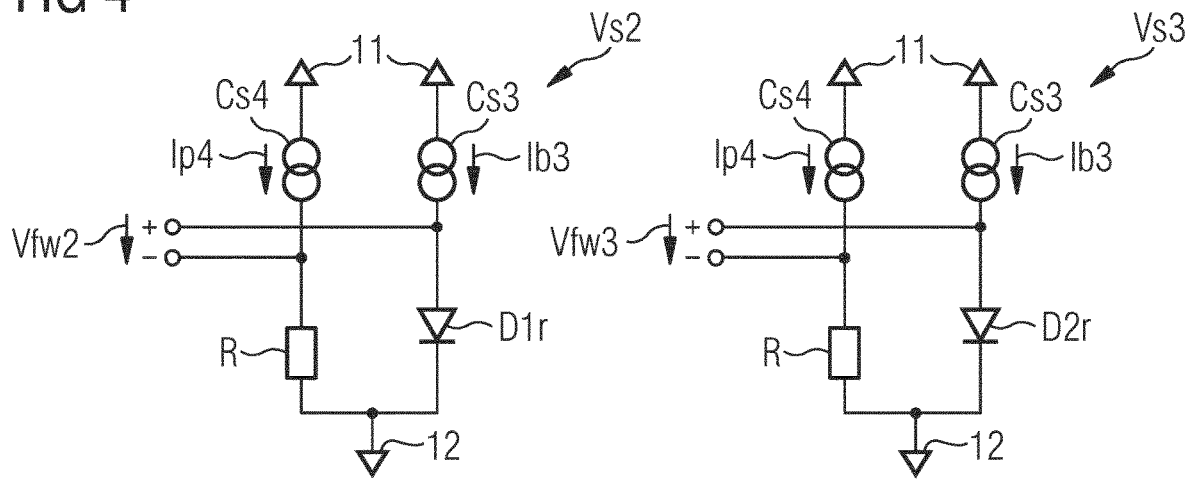
FIG. 4 shows respective embodiment examples of a second and a third voltage source as proposed.

FIG. 4 shows respective embodiment examples of the second and the third voltage source as proposed. The second voltage source Vs2 is depicted on the left-hand side, while the third voltage source Vs3 is depicted on the right-hand side.

The second and the third voltage source Vs2, Vs3 are realized in a similar way, with the difference that the second voltage source Vs2 comprises the first replica diode D1r, while the third voltage source Vs3 comprises the second replica diode D2r. Consequently, the second voltage source Vs2 provides the second forward voltage Vfw2 for the slide forward biasing of the first filter diode D1 as of FIG. 3. The third voltage source Vs3 provides the third forward voltage Vfw3 for realizing the slide forward biasing of the second filter diode D2 as of FIG. 3.

In detail, the second voltage source Vs2 comprises a third current source Cs3, a fourth current source Cs4, the first replica diode D1r and the resistor R. The third current source Cs3 is coupled to the supply potential 11 and to an anode terminal of the first replica diode D1r. Said connection point between the third current source Cs3 and the first replica diode D1r forms a first output of the second voltage source Vs2. The fourth current source Cs4 is coupled to the supply potential terminal 11 and to the resistor R which is turn is coupled to the generation reference potential terminal 12. A connection point between the fourth current source Cs4 and the resistor R forms a second output of the second voltage source Vs2. The third current source Cs3 is prepared to provide a third biasing current Ib3 with an adjustable level. The fourth current source Cs4 is prepared to provide a fourth biasing current Ip4 whose level is a function of the absolute temperature of the low-pass filter arrangement as of FIG. 3. This means that the fourth current source Cs4 is implemented in a similar way to the second current source Cs2 described above with reference to FIG. 2. A level of the third biasing current Ib3 is adjusted to be higher than the desired forward current through the first filter diode D1.

A voltage drop generated by the third biasing current Ib3 across the first replica diode Dr1 is provided at the first output of the second voltage source Vs2. A temperature-dependent voltage drop across the resistor R generated by the fourth biasing current Ip4 is provided at the second output of the second voltage source Vs2. The second adjustable forward voltage Vfw2 is consequently provided as the difference of the voltages at the first and the second output of the second voltage source Vs2.

The third voltage source Vs3 comprises the third current source Cs3, the fourth current source Cs4, the resistor R and the second replica diode D2r. In the third voltage source Vs3 the second replica diode D2r takes the role and position of the first replica diode D1r in the second voltage source Vs2. The third adjustable forward voltage Vfw3 is therefore provided as the difference between the temperature-dependent voltage drop across the resistor R generated by the fourth biasing current Ip4 and the voltage drop across the second replica diode D2r generated by the third biasing current Ib3.

By way of the second and the third voltage sources Vs2, Vs3 with the implementation as described above, the temperature dependency of the forward voltages of the first and the second filter diodes D1, D2 is taken into account in the generation of the second and the third forward voltages Vfw2, Vfw3. Thereby, the characteristics of the low-pass filter arrangement as of FIG. 3 will remain constant over the whole operating time.

Figure 5:
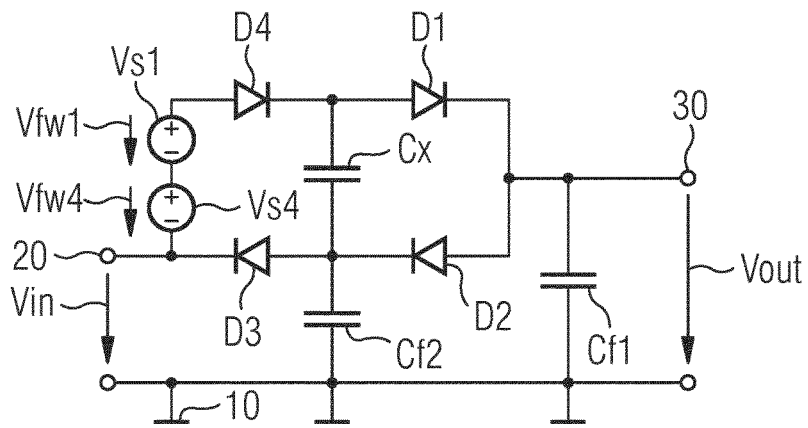
FIG. 5 shows a third embodiment example of a low-pass filter arrangement as proposed.

FIG. 5 shows a third embodiment example of a low-pass filter arrangement as proposed. The depicted third embodiment coincides with the first embodiment shown in FIG. 1 and comprises additional components. In addition to the first and the second filter diodes, D1, D2, the first filter capacitor Cf1 and the first voltage source Vs1, the third embodiment also comprises a third filter diode D3, a fourth filter diode D4, a fourth voltage source Vs4, a second filter capacitor Cf2 and a cross-capacitor Cx. First and fourth voltage source Vs1, Vs4 are coupled in series with respect to the input terminal 20 and with respect to the series connection of the first and the second filter diodes D1, D2. In detail, a series connection comprising the fourth voltage source Vs4, the first voltage source Vs1, the fourth filter diode D4 and the first filter diode D2 is connected between the input terminal 20 and the output terminal 30. The third filter diode D3 and the second filter diode D2 are connected in a serial connection between the input terminal 20 and the output terminal 30. The second filter capacitor Cf2 is connected to a connection point between the third filter diode D3 and the second filter diode D2. With its second terminal the second filter capacitor Cf2 is coupled to the filter reference potential terminal 10. The cross capacitor Cx is connected to the connection point between the first and the fourth filter diodes D1, D4, namely the cathode terminal of the fourth filter diode D4, and to the connection point between the third and the second filter diode D3, D2, namely the cathode terminal of the second filter diode D2. The fourth voltage source Vs4 is prepared to provide a fourth adjustable forward voltage Vfw4. By way of the fourth adjustable forward voltage Vfw4 in conjunction with the first adjustable forward voltage the third and the fourth filter diodes D3, D4, as well as, the first and the second filter diodes D1, D2 are both biased in a forward direction.

The depicted embodiment uses two diode filters in series compared with the first embodiment depicted in FIG. 1 and thereby achieves an even further improved noise suppression of the output voltage Vout. The fourth voltage source Vs4 can be implemented in a similar way as the first voltage source Vs1, for example, by using the embodiment depicted in FIG. 2 and replacing the first and the second replica diode by a replica of the third and the fourth filter diode.

Figure 6:
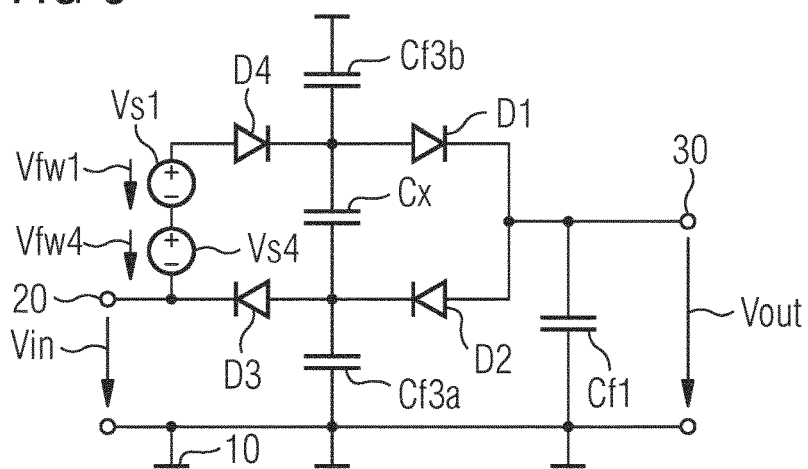
FIG. 6 shows a fourth embodiment example of a low-pass filter arrangement as proposed.

FIG. 6 shows a fourth embodiment example of a low-pass arrangement as proposed. The fourth embodiment example coincides with the third embodiment example depicted in FIG. 5, except for the implementation of the second filter capacitor. In the fourth embodiment example the second filter capacitor is realized by two capacitors Cf3a and Cf3b. Capacitor Cf3a is connected the same way as the second filter capacitor Cf2 of FIG. 2, namely to the connection point between the third and the second filter diode D3, D2 and to the filter reference potential terminal 10. The other capacitor Cf3b is coupled to the connection point between the first and the fourth filter diode D1, D4 and the filter reference potential terminal 10. The full capacitance value of the second filter capacitor Cf2 of the third embodiment is split up in the fourth embodiment into two capacitance values distributed between the capacitors Cf3a and Cf3b. The ratio of capacitance values between the capacitors Cf3a and Cf3b is a function of the parasitic capacitances of the filter diodes in the respectively connected series connections.

Figure 7:
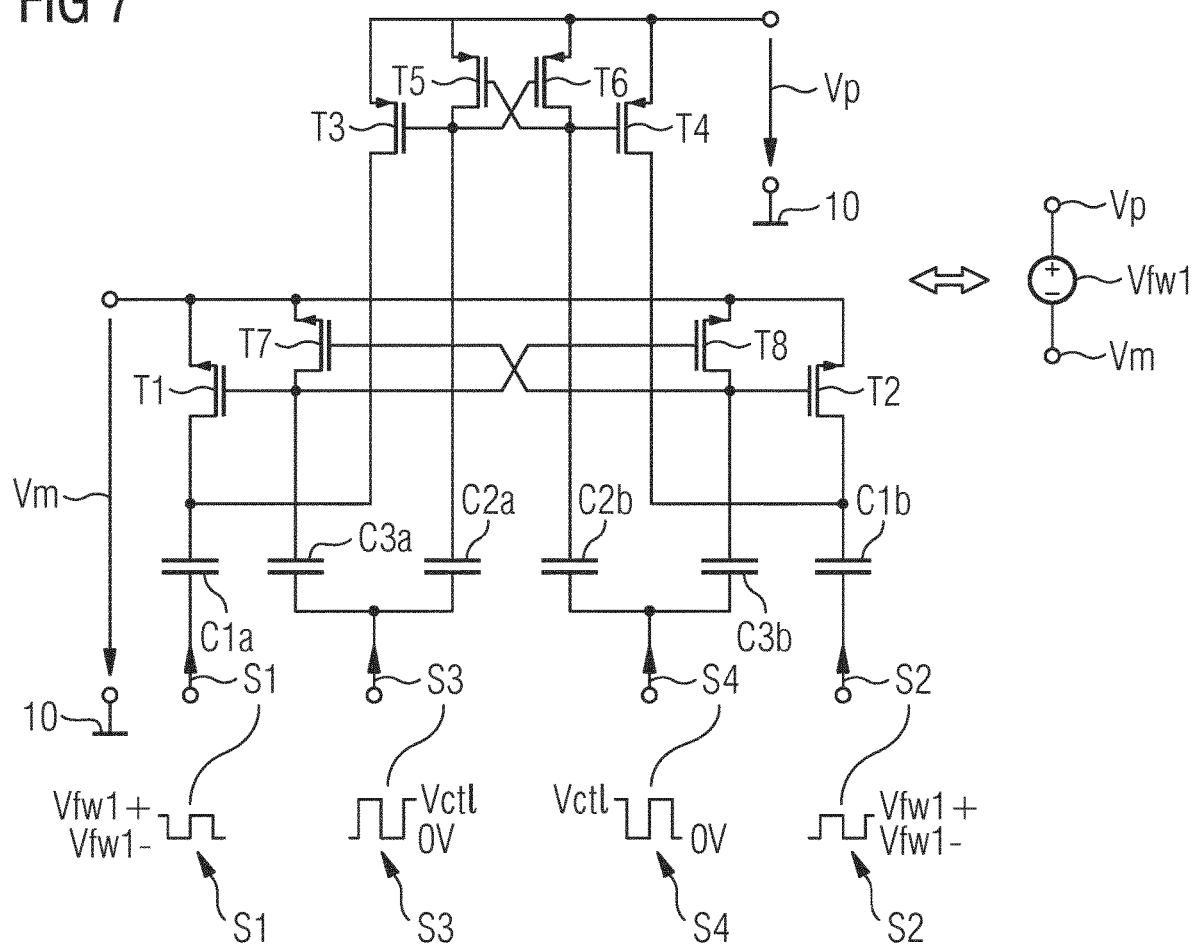
FIG. 7 shows an embodiment example of a charge pump circuit as proposed.

FIG. 7 shows an embodiment example of a charge pump circuit as proposed. The charge pump circuit comprises a main pumping path, a first gate control path and a second gate control path. The main pumping path has a first, a second, a third and a fourth transistor T1, T2, T3, T4 and a first and a second pumping capacitor C1a, C1b. The first gate control path has a fifth and a sixth transistor T5, T6 and a first and a second supplementary capacitor C2a, C2b. The second gate control path has a seventh and an eighth transistor T7, T8 and a third and a fourth supplementary capacitor C3a, C3b. The charge pump circuit is prepared to pump the first adjustable forward voltage Vfw1 to the level of the input voltage Vin. Each of the first and the second gate control path is respectively coupled to the main pumping path such that a control of the transistors of the main pumping path is independent of a level of the first adjustable forward voltage Vfw1.

The first pumping capacitor C1a is coupled with its first terminal to respective drain terminals of the first and the third transistor T1, T3 and is prepared to receive a first control signal S1 at its second terminal. The first control signal S1 comprises a first periodic rectangular signal having an amplitude corresponding to the absolute value of the first adjustable forward voltage Vfw1. The second pumping capacitor C1b is coupled with its first terminal to respective drain terminals of the second and the fourth transistor T2, T4 and is prepared to receive a second control signal S2 at its second terminal. The second control signal S2 is supplied in counter phase to the first control signal S1 and has an amplitude which is adapted to the amplitude of the first control signal S1.

The first supplementary capacitor C2a is coupled with its first terminal to a drain terminal of the fifth transistor T5 and to respective gate terminals of the third and the sixth transistor T3, T6 and is prepared to receive a third control signal S3 at its second terminal. The third control signal S3 comprises a second periodic rectangular signal having an amplitude corresponding to the level of an adjustable control voltage Vctl. The second supplementary capacitor C2b is coupled with its first terminal to a drain terminal of the sixth transistor T6 and to respective gate terminals of the fourth and the fifth transistor T4, T5 and is prepared to receive a fourth control signal S4 at its second terminal. The fourth control signal S4 is supplied in counter phase to the third control signal S3 and has an amplitude which is adapted to the amplitude of the third control signal S3.

The third supplementary capacitor C3a is coupled with its first terminal to a drain terminal of the seventh transistor T7 and to respective gate terminals of the first and the eighth transistor T1, T8 and is prepared to receive the third control signal S3 at its second terminal. The fourth supplementary capacitor C3b is coupled with its first terminal to a drain terminal of the eighth transistor T8 and to respective gate terminals of the second and the seventh transistor T2, T7 and is prepared to receive the fourth control signal S4 at its second terminal.

The first, the second, the seventh and the eighth transistor T1, T2, T7, T8 each comprise a MOS transistor of a same type, e.g. NMOS, and the third, the fourth, the fifth and the sixth transistor T3, T4, T5, T6 each comprise a MOS transistor of a same type which is complementary to the type of the first, the second, the seventh and the eighth transistor T1, T2, T7, T8.

Respective source terminals of the first, the second, the seventh and the eighth transistor T1, T2, T7, T8 are connected to each other and are prepared to receive or to provide a negative voltage Vm. Respective source terminals of the third, the fourth, the fifth and the sixth transistor T3, T4, T5, T6 are connected to each other and are prepared to receive or provide a positive voltage Vp.

The charge pump circuit realizes a floating voltage source for the first adjustable forward voltage Vfw1 as depicted in the equivalent circuit on the right-hand side of FIG. 7. This means that the absolute value of the first adjustable forward voltage Vfw1 which is generated by using of the circuit depicted in FIG. 2, for example, is pumped to the level of the negative voltage Vm. A typical value of the first adjustable forward voltage Vfw1 amounts to 400 mV. A typical value of the negative voltage Vm amounts to 20 V. Consequently, the floating voltage source, which is realized by the proposed charge pump circuit depicted in FIG. 7, provides the positive voltage Vp which corresponds to the relatively small first adjustable forward voltage Vfw1 at the level of the comparatively high negative voltage Vm. In this regard, the terms positive voltage Vp and negative voltage Vm shall be understood as respective names of the voltages Vp and Vm occurring at the positive and the negative pole or terminal of the floating voltage source depicted on the right-hand side of FIG. 7.

The depicted charge pump circuit realizes a separation of the two roles that a pumping capacitor in a state of the art implementation has, namely the switching of the transistors and the pumping of the voltages. For this purpose, the charge pump circuit has the main pumping path and the first and the second gate control paths. Consequently, switching of the PMOS transistors, namely the third and the fourth transistor T3, T4 of the main pumping path is controlled by the first gate control path, i.e. by the fifth and the sixth transistor T5, T6 using the control voltage Vctl. Switching of the NMOS transistors of the main pumping path, i.e. the first and the second transistor T1, T2, is controlled by the second control path by way of the seventh and the eight transistor T7, T8, in control of the third and the fourth control signal S3, S4 using the control voltage Vctl. The control voltage Vctl is chosen to be higher than the threshold voltage of the employed MOS transistors. As this higher control voltage Vctl is used for switching the transistors of the main pumping path, the relatively small first adjustable forward voltage Vfw1, which lies below the threshold voltage of a MOS transistor, is pumped to the level of the input voltage Vin.

In an implementation example of the circuit of FIG. 1, an absolute value of the first adjustable forward voltage Vfw1 is generated using the circuit in FIG. 2 and is pumped to the level of the input voltage by the charge pump circuit of FIG. 7. For this, the input voltage Vin of the low pass filter arrangement as of FIG. 1, for example, is supplied as the negative voltage Vm to the charge pump circuit. The charge pump circuit pumps the first adjustable forward voltage Vfw1 to the level of said input voltage Vin and therefrom provides the positive voltage Vp corresponding to the first adjustable forward voltage Vfw1 at the level of the input voltage Vin. In order to properly provide the first and the second control signal S1, S2, the first and the second output of the first voltage source Vs1 depicted in FIG. 2 is coupled by means of switches to the respective terminals of the charge pump circuit where the first and the second control signals S1, S2 are supplied. Said coupling switches are operated in counter phase. The first control signal S1 is provided in phase with the fourth control signal S4. The third control signal S3 is provided in phase with the second control signal S2.

In an implementation example of the circuits of FIG. 5 or 6, the first adjustable forward voltage Vfw 1 is generated as detailed above in the implementation example of the circuit of FIG. 1. Additionally, an absolute value of the fourth adjustable forward voltage Vfw4 is generated using the circuit in FIG. 2 and is also pumped to the level of the input voltage by the charge pump circuit of FIG. 7.

In an implementation example of the circuit of FIG. 3, the first adjustable forward voltage Vfw 1 is generated as the sum of the second and the third adjustable forward voltages Vfw2, Vfw3 using the circuits of FIG. 4. The resulting absolute value of the first adjustable forward voltage Vfw1 is pumped to the level of the input voltage Vin by the charge pump circuit of FIG. 7.

FIG. 8 shows a first embodiment example of a voltage sourcing arrangement as proposed. The voltage sourcing arrangement comprises the low-pass filter arrangement with first and second filter diodes D1, D2, the first filter capacitor Cf1, the first voltage source Vs1 and an input signal source V which is coupled to the input terminal 20 of the low-pass filter arrangement. The input signal source V is prepared to provide the input voltage Vin. The input signal source V is also coupled to the filter reference potential terminal 10. The input signal source V may be realized by a state of the art charge pump.

The presented voltage sourcing arrangement provides the output voltage Vout with a well-defined operating point after low-pass filtering the input voltage Vin. Consequently, the output voltage Vout can well be used for biasing a MEMS microphone sensor, for example.

Figure 9:
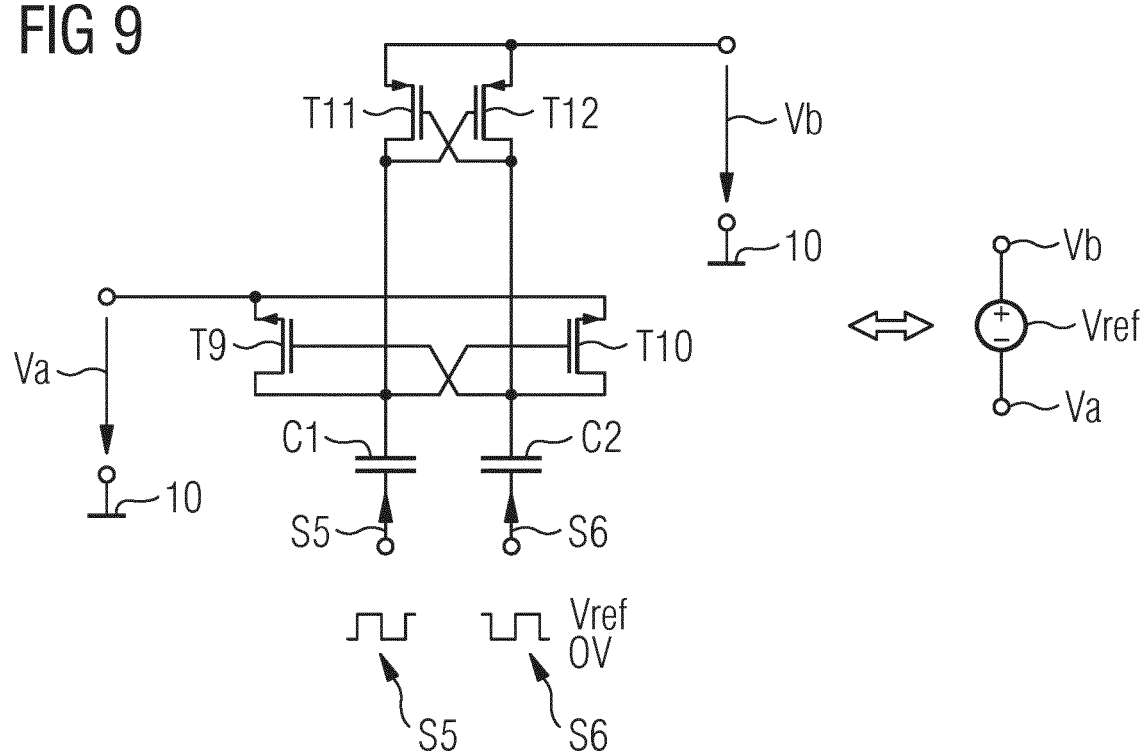
FIG. 9 shows an exemplary charge pump to be used as input signal source in the proposed voltage sourcing arrangement.

FIG. 9 shows an exemplary charge pump as known to those skilled in the art to be used as an example input signal source in the proposed voltage sourcing arrangement. The charge pump comprises a ninth, a tenth, an eleventh and a twelfth transistor T9, T10, T11, T12, a first capacitor C1 and a second capacitor C2. The ninth and the tenth transistor T9, T10 are implemented as MOS transistors of the same type, for instance as NMOS transistors, whereas the eleventh and the twelfth transistors T11, T12 are implemented as MOS transistors of the same type, but complementary to the transistors T9 and T10. A first terminal of the first capacitor C1 is coupled to respective drain terminals of the ninth and the eleventh transistor T9, T11 and also to respective gate terminals of the tenth and the twelfth transistor T10, T12. A second terminal of the first capacitor C1 is supplied with a fifth control signal S5 comprising a periodic rectangular signal having an amplitude of a reference voltage Vref. A first terminal of the second capacitor C2 is coupled to respective drain terminals of the tenth and the twelfth transistor T10, T12, and also to respective gate terminals of the ninth and the eleventh T9, T11. A second terminal of the second capacitor C2 is supplied with a sixth control signal S6. The sixth control signal S6 is adapted in its amplitude to the fifth control signal S5 and is provided in counter phase with respect to the fifth control signal S5.

A source terminal of the ninth transistor T9 is coupled to a source terminal of the tenth transistor T10 and serves as a charge pump input to which a first voltage Va is provided. A source terminal of the eleventh transistor T11 is coupled to a source terminal of the twelfth transistor T12 and forms a charge pump output at which a second voltage Vb is provided.

A simplified equivalent circuit of the charge pump is depicted on the right-hand side of FIG. 9. The charge pump can be regarded as a floating voltage source for the reference voltage Vref.

The first and the second capacitor C1, C2 are driven by the two counter phase rectangular wave form signals, i.e. the fifth and the sixth control signal S5, S6, with a peak-to-peak voltage of the reference voltage Vref. This causes the NMOS transistors T9 and T10 and the PMOS transistors T11 and T12 to switch such that the second voltage Vb at the output of the charge pump settles to a value which corresponds to a sum of the first voltage Va at the charge pump input and the reference voltage Vref.

The reference voltage Vref is chosen to be higher than the threshold voltage of the involved transistors T9, T10, T11 and T12.

For implementation in a MEMS microphone sensor, multiple charge pumps as of FIG. 7, for example ten, are stacked to get the desired high biasing voltage, e.g. 20 V, for the sensor. To suppress the noise and ripple from the voltage finally generated with these stacked charge pumps, the proposed low pass filter arrangement is used.

Figure 10:
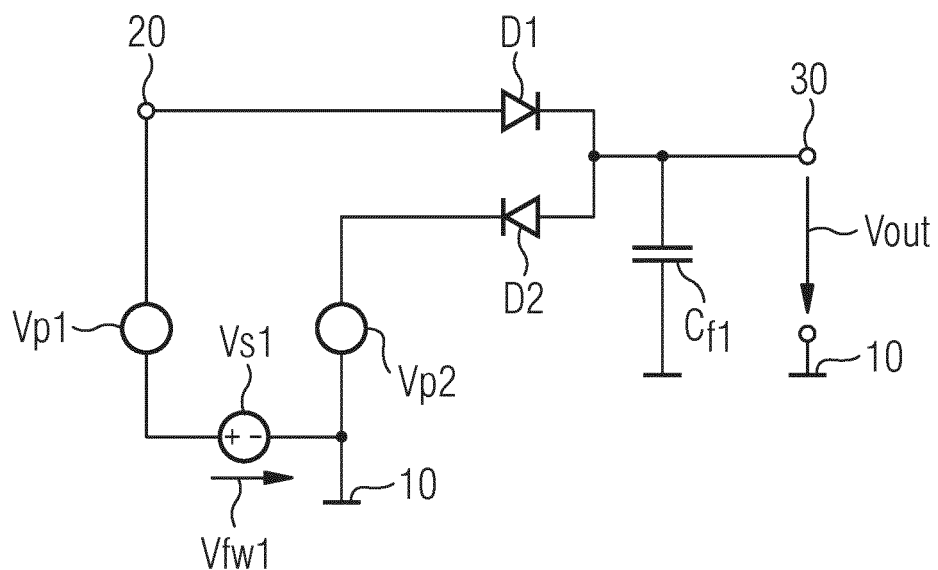
FIG. 10 shows a second embodiment example of a voltage sourcing arrangement as proposed.

FIG. 10 shows a second embodiment example of a voltage sourcing arrangement as proposed. The voltage sourcing arrangement comprises the low-pass filter arrangement with the first and the second filter diodes D1, D2, the first filter capacitor Cf1 and the first voltage source Vs1 similar to the low-pass filter arrangement of FIG. 1. The voltage sourcing arrangement further comprises a first and a second charge pump Vp1 and Vp2. The first voltage source Vs1 is coupled to the input 20 of the low-pass filter arrangement via the first charge pump Vp1. With its other terminal the first voltage source Vs1 is coupled to the filter reference potential terminal 10. The second charge pump Vp2 is coupled between the filter reference potential terminal 10 and the cathode terminal of the second filter diode D2.

In this embodiment the first adjustable forward voltage Vfw1, which achieves the slight forward biasing of the first and the second filter diodes D1, D2, is established by introducing the first voltage source Vs1 at the bottom side of the first and the second charge pumps Vp1, Vp2 which in sum provide the input voltage Vin as of FIG. 1. The first and the second charge pump Vp1, Vp2 are each implemented by using the architecture of the charge pump depicted in FIG. 9. In this embodiment the first voltage source Vs1 is implemented by directly using the circuit depicted in FIG. 2 without an additional charge pump circuit as of FIG. 7, because the pumping of the generated first adjustable forward voltage Vfw1 to the level of the input voltage is accomplished by the first and the second charge pumps Vp1, Vp2.

Figure 11:
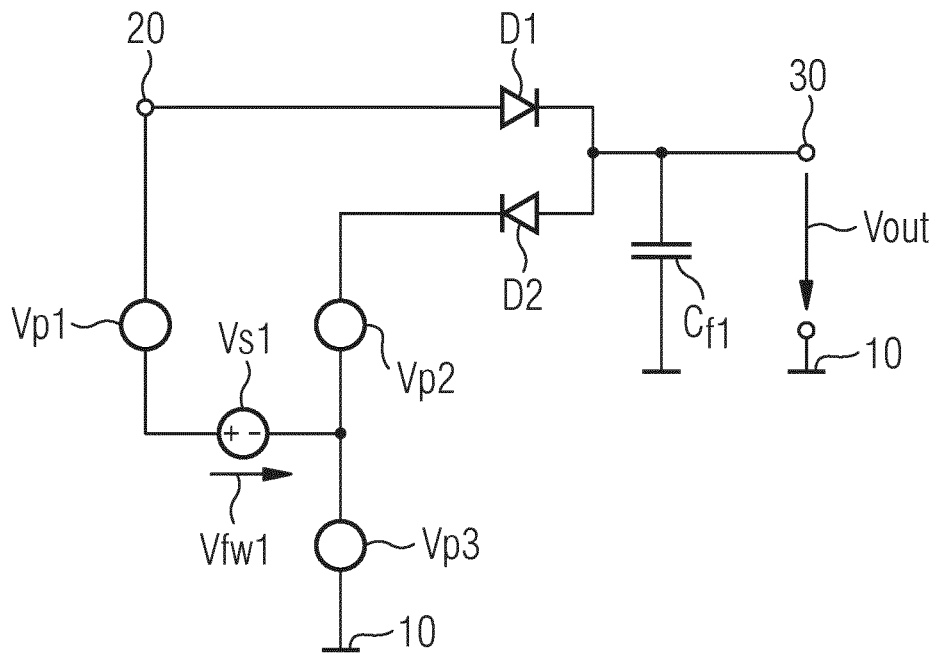
FIG. 11 shows a third embodiment example of a voltage sourcing arrangement as proposed.

FIG. 11 shows a third embodiment example of a voltage sourcing arrangement as proposed. The embodiment example of FIG. 11 coincides with the embodiment example of FIG. 10 and additionally comprises a third charge pump Vp3. The third charge pump Vp3 is coupled to a connection point between the first voltage source Vs1 and the second charge pump Vp2, on the one hand, and on the other hand to the filter reference potential terminal 10. The first voltage source Vs1 which provides the first adjustable forward voltage Vfw1 is introduced here between multiple stages of the first, the second and the third charge pump Vp1, Vp2, Vp3, in sum realizing the input signal source for providing the input voltage Vin as of FIG. 1, for example. This means that provisioning of the input voltage Vin for the low-pass filter arrangement is split up into three sub-units through the first, the second and the third charge pump Vp1, Vp2, Vp3. In an exemplary implementation eight charge pump stages as of FIG. 9 are used to realize the third charge pump Vp3 and two charge pump stages as of FIG. 9 are used to realize each of the first and the second charge pump Vp1, Vp2.

It is to be understood that any feature described in relation to any one embodiment may be used alone, or in combination with other features described, and may also be used in combination with one or more features of any other of the embodiments, or any combination of any other of the embodiments unless described as alternative. Furthermore, equivalents and modifications not described above may also be employed without departing from the scope of the low-pass filter arrangement as defined in the accompanying claims.

The invention claimed is:

1. A low-pass filter arrangement having
   an input terminal for receiving an input voltage,
   a first voltage source coupled to the input terminal,
   a serial connection comprising a first and a second filter diode, the serial connection being coupled to the first voltage source, wherein a connection point between the first and the second filter diode is coupled to an output terminal of the filter arrangement,
   a first filter capacitor coupled between the output terminal and a filter reference potential terminal,
   wherein the first voltage source is adapted to provide a first adjustable forward voltage whereby the first and the second filter diodes are both biased in a forward direction.

2. The low-pass filter arrangement according to claim 1, wherein the first voltage source comprises a first current source, a second current source, a resistor, a first and a second replica diode,
   wherein the first current source is coupled to a supply potential terminal and in series to a serial connection consisting of the first and the second replica diode, said serial connection in turn being coupled to a generation reference potential terminal and a connection point between the first current source and said serial connection forms a first output of the first voltage source,
   wherein the second current source is coupled to the supply potential terminal and in series to the resistor which in turn is coupled to the generation reference potential terminal and a connection point between the second current source and the resistor forms a second output of the first voltage source, and wherein an absolute value of the first adjustable forward voltage is provided between the first and the second output of the first voltage source.

3. The low-pass filter arrangement according to claim 2, wherein the first current source is adapted to provide a first biasing current with an adjustable level, the second current source is adapted to provide a second biasing current a level of which being a function of an absolute temperature of the low-pass filter arrangement, and wherein the first replica diode is adapted in size to the first filter diode of the filter arrangement in order to form a replica of said first filter diode and the second replica diode is adapted in size to the second filter diode of the filter arrangement in order to form a replica of said second filter diode.

4. The low-pass filter arrangement according to claim 1, wherein the first voltage source comprises a second and a third voltage source which are connected in series to each other, wherein a connection point between the second and the third voltage source is connected to the input terminal of the filter arrangement, and wherein an absolute value of the first adjustable forward voltage is provided as a sum of a second adjustable forward voltage provided by the second voltage source and a third adjustable forward voltage provided by the third voltage source.

5. The low-pass filter arrangement according to claim 4, wherein each of the second voltage source and the third voltage source comprises a third current source, a fourth current source, a resistor and a first or a second replica diode, wherein the third current source is coupled to a supply potential terminal and in series to the first or to the second replica diode, said diode in turn being coupled to a generation reference potential terminal and wherein a connection point between the third current source and said replica diode forms a first output of the second or third voltage source, wherein the fourth current source is coupled to the supply potential terminal and in series to the resistor which in turn is coupled to the generation reference potential terminal and a connection point between the fourth current source and the resistor forms a second output of the second or third voltage source, and wherein the second or the third adjustable forward voltage is provided respectively between the first and the second output of the second or third voltage source.

6. The low-pass filter arrangement according to claim 5, wherein the third current source is adapted to provide a third biasing current with an adjustable level, the fourth current source is adapted to provide a fourth biasing current a level of which being a function of an absolute temperature of the low-pass filter arrangement, and wherein the first replica diode is adapted in size to the first filter diode of the filter arrangement in order to form a replica of said first diode and the second replica diode is adapted in size to the second diode of the low-pass filter arrangement in order to form a replica of said second filter diode.

7. The low-pass filter arrangement according to claim 1 further comprising a fourth voltage source coupled in series to the first voltage source and to the input terminal, a third and a fourth filter diode, the third filter diode being coupled in series to the second filter diode and to the input terminal, the fourth filter diode being coupled in series to the first filter diode and to the first voltage source, a second filter capacitor, and a cross-capacitor connected to a connection point between the first and the fourth filter diode and to a connection point between the third and the second filter diode, wherein the fourth voltage source is adapted to provide a fourth adjustable forward voltage whereby the third and the fourth filter diodes are both biased in a forward direction.

8. The low-pass filter arrangement according to claim 7, wherein the second filter capacitor either is realized by a single capacitor coupled to a connection point between the third and the second diode and the filter reference potential terminal, or the second filter capacitor is realized by two capacitors, one of said two capacitors being connected to the connection point between the first and the fourth filter diode and the other of said two capacitors being connected to the connection point between the third and the second filter diode.

9. The low-pass filter arrangement according to claim 1, wherein the first voltage source additionally comprises a charge pump circuit which is prepared to pump the first adjustable forward voltage to a level of the input voltage.

10. The low-pass filter arrangement according to the claim 9, wherein the charge pump circuit comprises a main pumping path comprising a first, a second, a third and a fourth transistor and a first and a second pumping capacitor, a first gate control path having a fifth and a sixth transistor and a first and a second supplementary capacitor, and a second gate control path having a seventh and an eighth transistor and a third and a fourth supplementary capacitor, wherein each of the first and the second gate control path is respectively coupled to the main pumping path such that a control of the transistors of the main pumping path is independent of a level of the first adjustable forward voltage, and wherein the charge pump circuit is prepared to provide a positive voltage which corresponds to the first adjustable forward voltage at the level of the input voltage (Vin).

11. The low-pass filter arrangement according to claim 10, wherein the first pumping capacitor is coupled with its first terminal to respective drain terminals of the first and the third transistor and is prepared to receive a first control signal at its second terminal, the first control signal comprising a first periodic rectangular signal having an amplitude corresponding to an absolute value of the first adjustable forward voltage, wherein the second pumping capacitor is coupled with its first terminal to respective drain terminals of the second and the fourth transistor and is prepared to receive a second control signal at its second terminal, the second control signal being in counter phase to the first control signal and having an amplitude which is adapted to the amplitude of the first control signal, wherein the first supplementary capacitor is coupled with its first terminal to a drain terminal of the fifth transistor and to respective gate terminals of the third and the sixth transistor and is prepared to receive a third control signal at its second terminal, the third control signal comprising a second periodic rectangular signal having an amplitude corresponding to the level of an adjustable control voltage, wherein the second supplementary capacitor is coupled with its first terminal to a drain terminal of the sixth transistor and to respective gate terminals of the fourth and the fifth transistor and is prepared to receive a fourth control signal at its second terminal, the fourth control signal being in counter phase to the to the third control signal and having an amplitude which is adapted to the amplitude of the third control signal, wherein the third supplementary capacitor is coupled with its first terminal to a drain terminal of the seventh transistor and to respective gate terminals of the first and the eighth transistor and is prepared to receive the third control signal at its second terminal, wherein the fourth supplementary capacitor is coupled with its first terminal to a drain terminal of the eighth transistor and to respective gate terminals of the second and the seventh transistor and is prepared to receive the fourth control signal at its second terminal, wherein the first, the second, the seventh and the eighth transistor each comprise a metal-oxide semiconductor, MOS, transistor of a same type, and wherein the third, the fourth, the fifth and the sixth transistor each comprise a MOS transistor of a same type which is complementary to the type of the first, the second, the seventh and the eighth transistor.

12. The low-pass filter arrangement according to claim 10,
wherein respective source terminals of the first, the second, the seventh and the eighth transistor are connected to each other and are prepared to receive or provide a negative voltage, and
wherein respective source terminals of the third, the fourth, the fifth and the sixth transistor are connected to each other and are prepared to receive or provide the positive voltage.

13. The low-pass filter arrangement according to claim 1,
wherein the first adjustable forward voltage is dynamically adjusted according to the actual temperature of the low-pass filter arrangement and/or according to a time of operation.

14. A voltage sourcing arrangement having
a low-pass filter arrangement according to claim 1, and
an input signal source which is coupled to the input terminal of the low-pass filter arrangement, the input signal source being prepared to provide the input voltage.

15. A microphone arrangement comprising a micro-electromechanical system, MEMS, microphone and a voltage sourcing arrangement according to claim 14,
wherein a voltage provided at the output terminal of the low-pass filter arrangement of the voltage sourcing arrangement is prepared to bias operation of the MEMS microphone.

* * * * *